(12) United States Patent
Fang et al.

(10) Patent No.: US 11,942,954 B2
(45) Date of Patent: Mar. 26, 2024

(54) DELAY LOCKED LOOP CIRCUITRY AND MEMORY DEVICE

(71) Applicant: GIGADEVICE SEMICONDUCTOR (SHANGHAI) INC., Shanghai (CN)

(72) Inventors: Haibin Fang, Shanghai (CN); Biyun Huang, Shanghai (CN); Dongsheng Tang, Shanghai (CN)

(73) Assignee: GIGADEVICE SEMICONDUCTOR (SHANGHAI) INC., Shanghai (CN)

( * ) Notice: Subject to any disclaimer, the term of this patent is extended or adjusted under 35 U.S.C. 154(b) by 0 days.

(21) Appl. No.: 18/166,169

(22) Filed: Feb. 8, 2023

(65) Prior Publication Data

US 2023/0412173 A1 Dec. 21, 2023

(30) Foreign Application Priority Data

Jun. 20, 2022 (CN) .......................... 202210737347.9
Sep. 30, 2022 (CN) .......................... 202211215742.7

(51) Int. Cl.
*H03L 7/081* (2006.01)
*G11C 11/4076* (2006.01)

(52) U.S. Cl.
CPC ........ *H03L 7/0816* (2013.01); *G11C 11/4076* (2013.01)

(58) Field of Classification Search
CPC .......................... H03L 7/0816; G11C 11/4076
See application file for complete search history.

(56) References Cited

U.S. PATENT DOCUMENTS

| | | | | |
|---|---|---|---|---|
| 7,348,819 B2* | 3/2008 | Choi | ..................... | H03L 7/0805 327/158 |
| 7,492,200 B2* | 2/2009 | Na | ......................... | H03L 7/089 327/158 |
| 8,242,821 B2* | 8/2012 | Bae | ....................... | H03L 7/0814 327/158 |
| 8,390,351 B2* | 3/2013 | Choi | ..................... | G11C 7/1072 327/158 |
| 11,004,499 B1* | 5/2021 | Kim | .................... | G11C 11/4076 |
| 11,049,543 B2* | 6/2021 | Miyano | ................. | G11C 11/406 |
| 11,545,199 B2* | 1/2023 | Howe | .................. | G11C 7/1057 |
| 2007/0069773 A1* | 3/2007 | Choi | ..................... | H03L 7/0814 327/158 |
| 2007/0176657 A1* | 8/2007 | Byun | .................... | H03L 7/0814 327/158 |

(Continued)

*Primary Examiner* — Adam D Houston
(74) *Attorney, Agent, or Firm* — Ziegler IP Law Group

(57) ABSTRACT

Delay locked loop (DLL) circuitry system and a memory device are disclosed. The DLL circuitry system includes a timer unit and a DLL circuit coupled thereto. The timer unit is enabled to generate a DLL enable signal based on the signal instructing the entry into a low power consumption mode and a predefined timer condition. The DLL enable signal enables the DLL circuit to realign an internal clock signal with an external clock signal. In this way, the DLL circuit is avoided from being unable to align the internal clock signal with the external clock signal because the memory device enters the low power mode which causes the variation of the power supply voltage of the DLL circuit. Moreover, a read or write error that may occur when data is to be read or written immediately after exiting the low power consumption mode is also avoided.

19 Claims, 7 Drawing Sheets

(56) References Cited

U.S. PATENT DOCUMENTS

| | | | | |
|---|---|---|---|---|
| 2013/0028037 A1* | 1/2013 | Fujisawa | ............. | G11C 11/4093 |
| | | | | 365/222 |
| 2013/0028038 A1* | 1/2013 | Fujisawa | ........... | G11C 11/40615 |
| | | | | 365/222 |
| 2015/0043299 A1* | 2/2015 | Miyano | ................. | G11C 7/222 |
| | | | | 365/233.13 |
| 2017/0186471 A1* | 6/2017 | Qawami | ................ | G11C 7/222 |
| 2018/0358061 A1* | 12/2018 | Choi | ........................ | G11C 7/12 |
| 2023/0412173 A1* | 12/2023 | Fang | .................... | H03L 7/0816 |

\* cited by examiner

DELAY LOCKED LOOP CIRCUITRY AND MEMORY DEVICE

CROSS-REFERENCES TO RELATED APPLICATIONS

This application claims the priority of Chinese patent application number 202210737347.9, filed on Jun. 20, 2022, and the priority of Chinese patent application number 202211215742.7, filed on Sep. 30, 2022, the entire contents of which are incorporated herein by reference.

TECHNICAL FIELD

The present invention relates to the field of delay locked loops (DLLs) and, in particular, to DLL circuitry system and a memory device.

BACKGROUND

With the development of electronic technology, double data rate (DDR) synchronous dynamic random-access memory (SDRAM) devices are operating at increasingly higher frequency. In order to reduce power consumption, a DDR SDRAM device may switch to a low power consumption mode after the completion of a read or write operation to avoid unnecessary power consumption.

When data is to be read from or written to the DDR SDRAM device, the device usually employs a DLL circuit to align an internal clock signal thereof to an external clock signal (i.e., phase locking) to ensure that the data is correctly read or written. The DLL circuit will consume much power if it is always active. Therefore, once the DDR SDRAM device switches to the low power consumption mode, a DLL controller in the DLL circuit may be taken out of operation to reduce power consumption.

However, a significant power supply voltage change will be experienced by the DLL circuit after the DDR SDRAM device enters the low power consumption mode. As a result, a read or write error may occur when data is to be read or written immediately after the DDR SDRAM device exits the low power consumption mode.

SUMMARY OF THE INVENTION

It is an objective of the present invention to address the problem that a read or write error may occur when data is to be read or written immediately after a memory device exits a low power consumption mode, by presenting DLL circuitry system and a memory device.

The above objective is attained by DLL circuitry system provided in the present invention, which includes: a DLL circuit configured to receive an external clock signal and generate an internal clock signal delayed relative to the external clock signal and lock the internal clock signal in phase with the external clock signal; and a timer unit coupled to an enable terminal of the DLL circuit and configured to be enabled in response to a signal instructing entry into a low power consumption mode from outside of the DLL circuitry system and generate, based on the signal instructing entry into the low power consumption mode and a predefined timer condition, a DLL enable signal which enables the DLL circuit to allow the DLL circuit to relock the internal clock signal in phase with the external clock signal.

Optionally, the DLL circuitry system may be disposed in a memory device, and the timer unit may be configured to control the enabling of the DLL circuit when the memory device is in the low power consumption mode.

Optionally, the memory device may enter the low power consumption mode when receiving a command instructing it to enter the low power consumption mode, and the low power consumption mode may include a self-refresh mode or a power-down mode of the memory device.

Optionally, the DLL circuitry system may be disposed in a memory device including: a mode register configured to set a condition for entry of the memory device into the low power consumption mode; and a control circuit configured to, when it receives a command instructing entry into the low power consumption mode and when a clock enable signal is disabled, enable the signal instructing entry into the low power consumption mode based on the condition set by the mode register, wherein the command instructing entry into the low power consumption mode and the clock enable signal are from a memory controller disposed outside of the memory device.

Optionally, the predefined timer condition may be a count threshold, wherein the timer unit is configured to start counting in response to the signal instructing entry into the low power consumption mode is enabled, and upon the count reaching the count threshold, generate the DLL enable signal that enables the DLL circuit.

Optionally, the predefined timer condition may be a count threshold, wherein the timer unit is configured to start counting and continuously enable the DLL enable signal that enables the DLL circuit in response to the signal instructing entry into the low power consumption mode is enabled and, upon the count reaching the count threshold, stop enabling the DLL circuit.

Optionally, the count threshold may be determined by a stabilization time for a power supply voltage of the DLL circuit.

Optionally, the predefined timer condition may be a predetermined duty cycle, wherein the timer unit is configured to output, in response to the signal instructing entry into the low power consumption mode is enabled, the DLL enable signal which has the predetermined duty cycle and intermittently enables the DLL circuit until the signal instructing entry into the low power consumption mode is disabled.

Optionally, the predetermined duty cycle may be determined by at least one of: an amount of change in a power supply voltage of the DLL circuit; an offset of the internal clock signal from the external clock signal caused by entry of a memory device in which the DLL circuitry system is disposed into the low power consumption mode; a period of time taken by each calibration cycle of the DLL circuit; and a width of each cycle of a system clock on which the timer unit is based to enable the DLL circuit.

Optionally, the DLL circuit may include: a DLL delay line configured to delay the external clock signal and output the delayed external clock signal; a clock buffer circuit coupled to the DLL delay line and configured to output the clock signal output from the DLL delay line as the internal clock signal; a replica clock buffer circuit coupled to the DLL delay line and configured to generate a feedback clock signal based on the clock signal output from the DLL delay line; a DLL phase detector coupled to the replica clock buffer circuit and configured to compare the external clock signal with the feedback clock signal and determine a phase difference therebetween; and a DLL controller coupled to the DLL phase detector and the DLL delay line and configured to adjust, based on a comparison result from the DLL phase detector, a delay provided by the DLL delay line and hence the phase difference between internal clock signal and the external clock signal, wherein the timer unit is coupled to the DLL phase detector, the DLL controller and the replica clock buffer circuit.

Optionally, after the DLL circuit is enabled and locks the internal clock signal in phase with the external clock signal, the DLL controller may output a DLL lock signal which disables the DLL enable signal.

Optionally, the DLL controller may have a DLL state machine, which is coupled to the DLL phase detector and the DLL delay line and is configured to adjust, based on an output from the DLL phase detector, the delay of the DLL delay line and hence a phase of a rising edge of the internal clock signal, and when determining that the number of times the rising edge of the internal clock signal crosses a rising edge of the external clock signal forth and back reaches a first threshold value, lock the delay of the DLL delay line, thereby locking the internal clock signal in phase with the external clock signal.

Optionally, the first threshold value may be smaller than a threshold used in normal operation of the DLL circuit for determining whether to lock the delay of the DLL delay line.

Optionally, the DLL circuit may further include a duty cycle correction (DCC) circuit having an input terminal receiving the external clock signal, another input terminal coupled to an output terminal of the replica clock buffer circuit, and an output terminal coupled to an input terminal of the DLL delay line, the DCC circuit configured to adjust a duty cycle of the internal clock signal based on the feedback clock signal until the duty cycle of the internal clock signal reaches a predetermined value.

Optionally, the DCC circuit may include: a duty cycle detection circuit coupled at an input terminal thereof to the output terminal of the replica clock buffer circuit and configured to detect a duty cycle of the feedback clock signal; a DCC controller coupled to an output terminal of the duty cycle detection circuit and configured to generate a duty cycle control signal based on a detection result from the duty cycle detection circuit; and a DCC adjustment circuit coupled to the DCC controller and the DLL delay line and configured to receive the external clock signal, generate a corresponding input clock signal and provide it to the DLL delay line, and adjust a duty cycle of the generated input clock signal under the control of the duty cycle control signal until the duty cycle of the internal clock signal reaches the predetermined value.

Optionally, the DCC controller may have a DCC state machine, which is coupled to the duty cycle detection circuit and the DCC adjustment circuit and is configured to control, based on an output from the duty cycle detection circuit, the DCC adjustment circuit to adjust the duty cycle of the input clock signal and hence the duty cycle of the internal clock signal, and when determining that the number of times the duty cycle of the internal clock signal crosses the predetermined value forth and back reaches a second threshold value, determine that the duty cycle of the internal clock signal reaches the predetermined value.

Optionally, the second threshold value may be smaller than a threshold used in normal operation of the DLL circuit for determining whether the duty cycle reaches the predetermined value.

Optionally, the DLL circuitry system may further include a low dropout regulator (LDO) circuit coupled to both the timer unit and the DLL circuit so as to provide them with the power supply voltage, wherein the power supply voltage varies due to a load change of the LDO circuit in the low power consumption mode.

Based on the same inventive concept, the present invention also provides a memory device including the DLL circuitry system as defined above, wherein the internal clock signal generated by the DLL circuitry system serves as a data strobe pulse signal for the memory device, and the DLL circuit in the DLL circuitry system locks the external clock signal for the memory device in phase with the data strobe pulse signal.

Compared with the prior art, the present invention has at least the following benefits:

1. In response to the signal instructing entry into the low power consumption mode (e.g., PWD signal), the timer unit is enabled to generate, based on the signal instructing entry into the low power consumption mode and the predefined timer condition, the DLL enable signal which enables the DLL circuit. In this way, even when the memory device incorporating the DLL circuit is in the low power consumption mode, the DLL circuit is still able to relock the internal clock signal in phase with the external clock signal. Thus, the DLL circuit can be avoided from being unlocked and hence unable to align the internal clock signal with the external clock signal as a result of a shift of the internal clock signal caused by variation of the power supply voltage of the DLL circuit upon entry of the memory device into the low power consumption mode.
2. A read or write error that may occur when data is to be read or written immediately after the memory device exits the low power consumption mode can be avoided.
3. Compared to detecting variation of the DLL circuit's power supply voltage using a voltage detection circuit in the prior art, the present invention is simple in structure, occupies a small circuit area, allows for low retrofitting cost and low power consumption, and is easy to implement.

DETAILED DESCRIPTION

Figure 1:
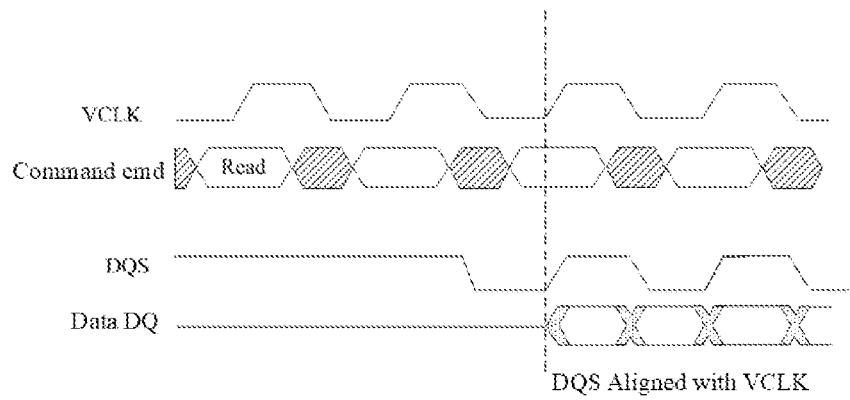
FIG. 1 shows a schematic timing diagram of a DDR memory device.

The following description sets forth numerous specific details in order to provide a more thorough understanding of the present invention. However, it will be apparent to those skilled in the art that the present invention can be practiced without one or more of these specific details. In other instances, well-known technical features have not been described in order to avoid unnecessary obscuring of the invention. It is to be understood that the invention may be embodied in many different forms and should not be construed as being limited to the embodiments set forth below. Rather, these embodiments are provided so that this disclosure is thorough and conveys the scope of the invention to those skilled in the art. In the drawings, like reference numerals refer to like elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the singular forms "a", "an" and "the" are intended to include the plural forms as well, unless the context clearly indicates otherwise. It will be further understood that the term "including" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

A DDR memory device is demanding on the accuracy of its two clocks, one of which is provided by an external bus (referred to hereinafter as the "external clock signal" denoted by VCLK), and the other is an internal clock generated by itself as required by its operation ("internal clock signal" by DQS). Referring to FIG. 1, it receives a command cmd (e.g., a read command Read cmd) from an external source under the control of the external clock signal VCLK, and in response to the receipt of the read command Read cmd, generates the internal clock signal DQS (DQ strobe, data strobe pulse) that serves as a clock for sending a data DQ signal. In other words, the external clock signal VCLK controls the reception of the read command Read cmd by the memory device, and the internal clock signal DQS controls sampling of the data DQ by the DDR memory device. Theoretically, the two clock signals are synchronous. For many reasons, such as slight discrepancies between the internal circuit of the DDR memory device and the external circuit, the internal clock signal DQS (i.e., the data strobe pulse signal) may not be aligned (i.e., asynchronous) with the external clock signal VCLK. When data reading is directly conducted based on the unaligned internal clock signal DQS and external clock signal VCLK and on the read command Read cmd, an eye opening of data from the DDR memory device will be reduced. Therefore, it is necessary to add a DLL circuit to the DDR memory device to lock the internal clock signal DQS in phase with the external clock signal VCLK (i.e., control a phase difference between DQS and VCLK within a predetermined range where the two signals can be considered as being aligned or with a zero phase difference). As a result, the read command Read cmd can be aligned with the data DQ, avoiding a reduced eye opening. Once DQS and VCLK are locked to (aligned with) each other, transmission of the data DQ will occur at rising and falling edges of VCLK.

Figure 2:
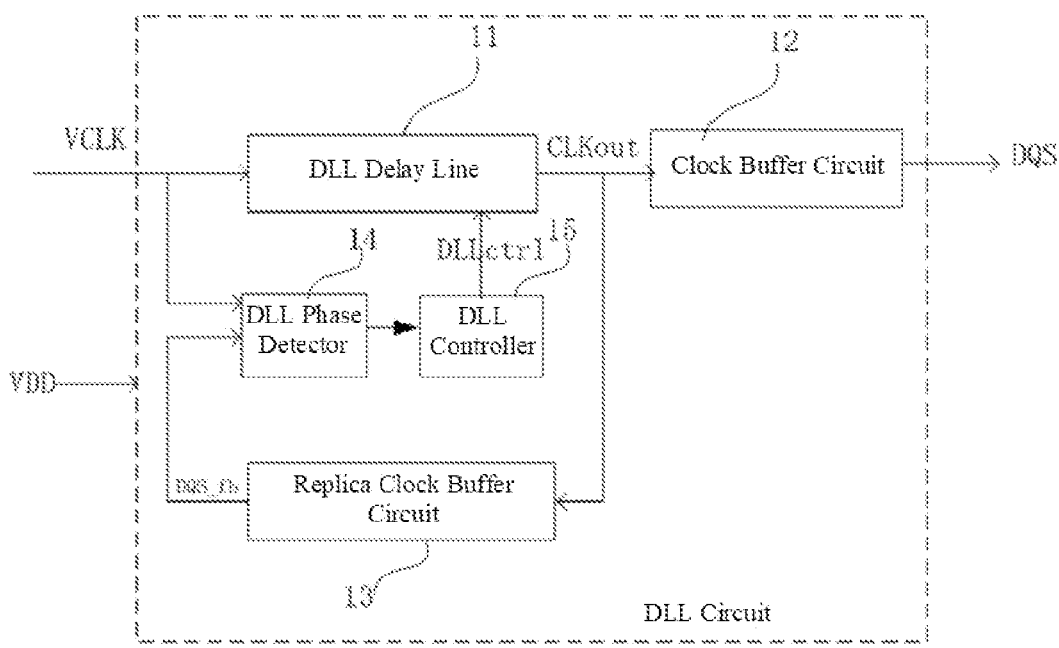
FIG. 2 is a schematic diagram showing the architecture of a DLL circuit in a known DDR memory device.

FIG. 2 is a block diagram of such a DLL circuit. The DLL circuit is composed of a DLL delay line 11, a clock buffer circuit 12, a replica clock buffer circuit 13, a DLL phase detector (PD) and a DLL controller 15. The replica clock buffer circuit 13 is a replica of the clock buffer circuit and is able to generate a feedback clock signal DQS_fb from an output signal CLKout of the delay line 11. The DLL delay line 11 is usually implemented as being controlled by a power supply voltage VDD. The DLL delay line 11 is included in the DLL circuit to reduce a phase difference between DQS and VCLK. Through adjusting the DLL delay line 11, the phase difference between DQS and VCLK can be tuned into the aforementioned predetermined range. Once this is achieved, the DLL delay line 11 is locked so that the internal and external clocks remain synchronous (i.e., aligned) with each other throughout subsequent operation of the DDR memory device.

For example, during a read operation, the external clock signal VCLK from the external circuit is delayed by the DLL delay line 11, and the delayed clock signal CLKout from the DLL delay line 11 is fed to the replica clock buffer circuit 13, which responsively generates the feedback clock signal DQS_fb. The DLL phase detector 14 samples and compares the external clock signal VCLK and the feedback clock signal DQS_fb from the replica clock buffer circuit 13 and feeds the comparison to the DLL controller 15. Based on the comparison, the DLL controller 15 then adjusts the DLL delay line 11 until the internal clock signal DQS from the clock buffer circuit 12 is aligned with the external clock signal VCLK. The delay of the DLL delay line 11 is then locked.

Considering the trend of such memory devices toward an increasingly high operating frequency, the DDR memory devices may switch to a low power consumption mode upon receiving a command instructing it to do so to avoid unnecessary power consumption. In the low power consumption mode, part of the DLL circuit including the DLL phase detector 14, the DLL controller 15 and the replica clock buffer circuit 13 may stay inactive.

However, after the DDR memory device enters the low power consumption mode under the control of the power down signal (i.e., the command that instructs the DDR memory device to enter the low power consumption mode, referred to hereinafter as the "PWD signal" for short), a power supply voltage of the DLL circuit will rise (i.e., experience a significant change) due to a reduced load current in a circuit (e.g., an LDO circuit) providing the power supply voltage), which will lead to a change in the delay provided by the DLL delay line 11 in the DLL circuit and hence a shift of DQS. Consequently, DQS and VCLK are no longer aligned with each other (i.e., they are not locked to each other anymore), and therefore when it is necessary to read or write data immediately after the DDR memory device exits the power down mode, a read or write error may occur.

Figure 3:
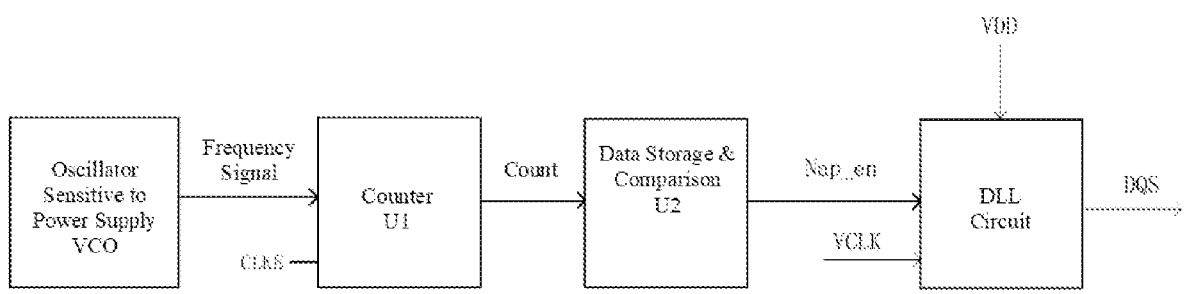
FIG. 3 is a schematic diagram showing the architecture of a voltage detection circuit for detecting variation of a power supply voltage in a DLL circuit, according to an embodiment of the present invention.

In order to overcome this problem, according to a non-preferred embodiment of the present invention shown in FIG. 3, an associated voltage detection circuit is employed to detect variation of the power supply voltage. When a significant change in the voltage (indicating a significant change in the delay of the DLL delay line) is detected, the DLL circuit is enabled to allow the DLL circuit to realign DQS with VCLK. The voltage detection circuit is generally composed of an oscillator VCO that is sensitive to the power supply voltage, a counter U1 and a data storage and comparison circuit U2.

Figure 4:
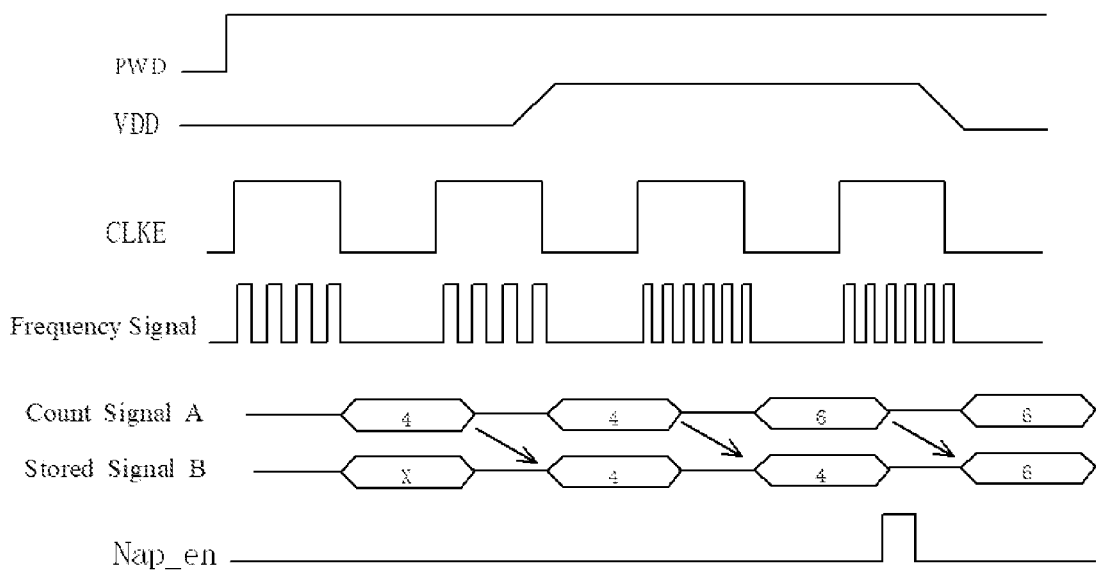
FIG. 4 is a schematic timing diagram of operation of the voltage detection circuit of FIG. 3.

FIG. 4 shows a timing diagram of operation of the voltage detection circuit. When the power down signal (i.e., the command that instructs the DDR memory device to enter the low power consumption mode, labeled as "PWD Signal" in FIG. 4) is enabled, the DDR memory device will enter the low power consumption mode. In response, the voltage detection circuit of FIG. 3 will be enabled, and the counter U1 therein will be enabled by a clock signal CLKE. A change in the power supply voltage will cause a frequency change in an output frequency signal from the oscillator VCO, which will in turn lead to a change in a count of the counter U1. When this new count (Count Signal A) differs from a previous count registered in the data storage and comparison circuit U2 (Stored Signal B), the data storage and comparison circuit U2 will output a pulse as an enable signal for the DLL circuit. As a result, the DLL circuit resumes operation to realign DQS with VCLK, ensuring correct data reading or writing after the DDR memory device exits the low power consumption mode.

The above non-preferred embodiment has at least the following disadvantages. First, it is complex in circuit structure and design and introduces a considerable increase in circuit area. Second, the voltage detection circuit operates as long as the DDR memory device is in the low power consumption mode and has a complex structure, introducing a substantial increase in power consumption. Third, the detection of the voltage detection circuit would take some time, and if the DDR memory device stays in the low power consumption mode for a very short period of time, the DLL circuit may not have sufficient time to accomplish the realignment of the internal and external clocks.

In addition to DDR memory devices, other memory devices adopting DLL circuits also suffer from the above problems.

In view of this, the present invention provides delay locked loop (DLL) circuitry system and a memory device. With a simple circuit structure, a DLL circuit can be enabled in a low power consumption mode of the memory device to align internal and external clocks (i.e., the above internal clock signal DQS and external clock signal VCLK) with each other. Even if it is necessary to read or write data immediately after the memory device exits the low power consumption mode, no read or write error will occur. Further, the undesirable addition of a large circuit area and a significant increase in power consumption can be avoided.

The present invention will be described in greater detail below with reference to particular embodiments thereof and the accompanying drawings. From the following description, advantages and features of the invention will become more apparent. Note that the figures are provided in a very simplified form not necessarily drawn to exact scale and for the only purpose of facilitating easy and clear description of the embodiments.

Figure 5:
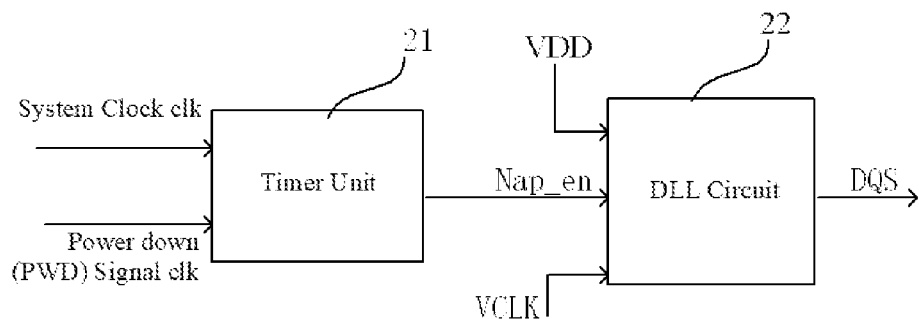
FIG. 5 is a schematic diagram showing the architecture of DLL circuitry system, according to an embodiment of the present invention.
Figure 6:
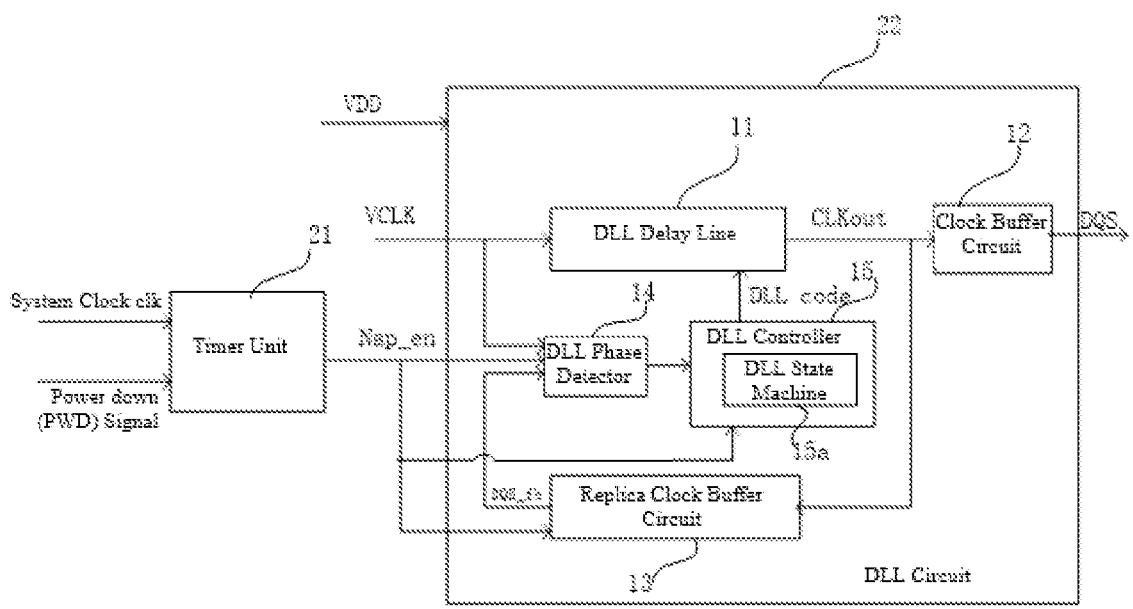
FIG. 6 is a schematic diagram showing an exemplary structure of the DLL circuitry system of FIG. 5.

Referring to FIGS. 5 and 6, in an embodiment of the present invention, there is provided DLL circuitry system including a timer unit 21 and a DLL circuit 22 coupled thereto. DLL circuit 22 is operable to receive an external clock signal VCLK and an internal clock signal DQS delayed in time with respect to the external clock signal VCLK and lock the internal clock signal in phase with the external clock signal (i.e., align edges of the internal clock signal DQS with those of the external clock signal VCLK). The timer unit 21 is coupled to an enable terminal of the DLL circuit 22 and configured to be enabled in response to a signal from outside of the DLL circuitry system, which instructs entry into a low power consumption mode (i.e., PWD signal), and generate, under the control of the signal, based on a predefined timer condition, a DLL enable signal for enabling the DLL circuit 22 to allow it to lock the internal clock signal in phase with the external clock signal (i.e., align them with each other).

This embodiment differs from that shown in FIG. 3 in that, when the DLL circuitry system is used in a memory device (e.g., SDRAM, PSRAM or the like), the timer unit 21 is adapted to enable the DLL circuit 22 in the low power consumption mode of the memory device. According to this embodiment, in the low power consumption mode of the memory device in which the DLL circuitry system is disposed, the timer unit 21 enables the DLL circuit 22 at a predetermined time determined by the predefined timer condition. Instead of detecting whether there is a change in the power supply voltage VDD of the DLL circuit 22, as long as the predefined timer condition is satisfied in in the low power consumption mode of the memory device, the DLL enable signal will be generated to enable the DLL circuit.

Figure 15:
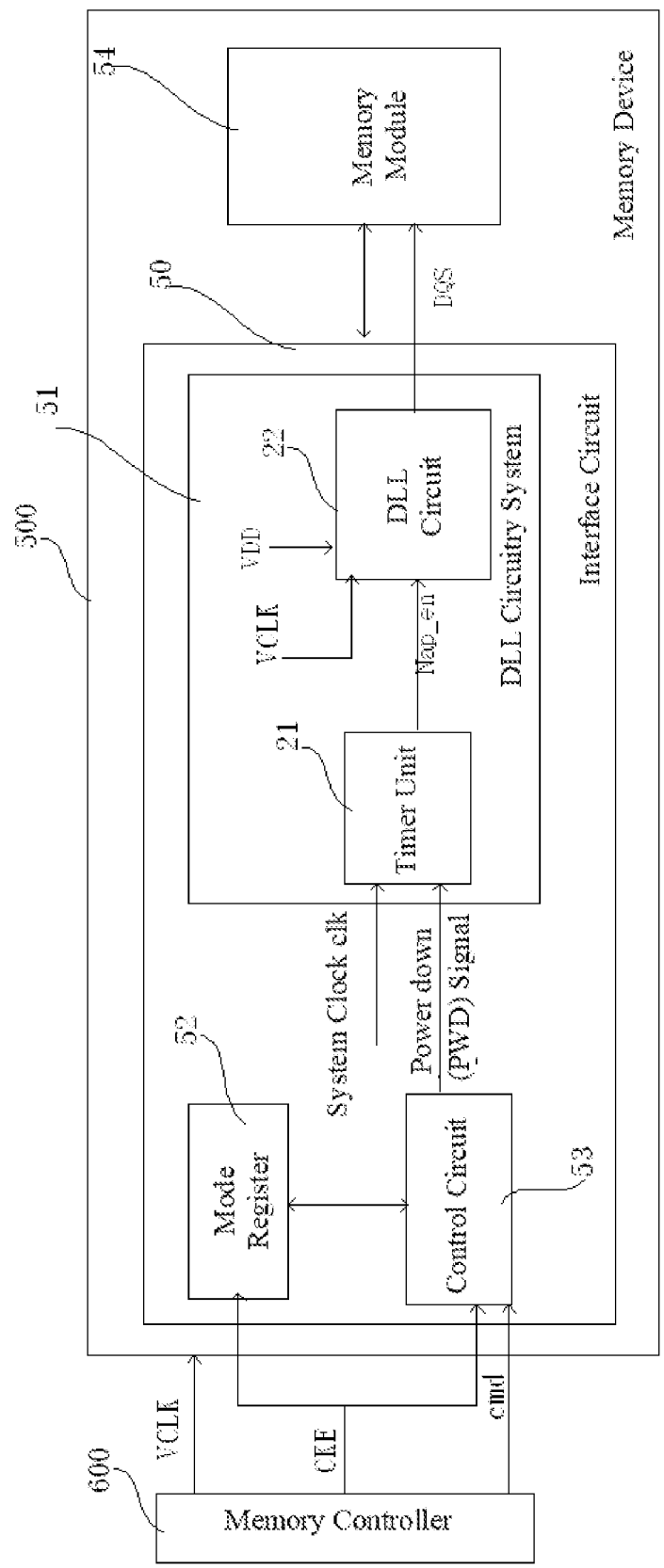
FIG. 15 is a schematic diagram showing the architecture of a memory device (in which the DLL circuitry system according to the present invention is provided) according to an embodiment of the present invention.

FIG. 15 schematically illustrates a memory device incorporating the proposed DLL circuitry system according to an embodiment of the present invention. The DLL circuitry system 51 is incorporated in the memory device (e.g., DDR SDRAM, PSRAM or the like) 500. In one embodiment, the DLL circuitry system 51 is implemented in an interface circuit 50 of the memory device 500. The timer unit 21 is configured to enable the DLL circuit 22 in a low power consumption mode of the memory device 500. Detailed description is set forth below regarding how the memory device 500 enters the low power consumption mode and how a signal instructing the entry (i.e., a power down (PWD) signal) is generated.

As shown in FIG. 15, the memory device 500 is controlled by an external memory controller 600. The memory controller 600 may be a DDR controller or a system memory controller. In one embodiment, the memory controller 600 is configured to send the command cmd and external clock signal VCLK of FIG. 1 to the memory device 500, receive data read from the memory device 500 and write data to the memory device 500.

The memory device 500 further includes a mode register 52, a control circuit 53 and a memory block 54. The memory block 54 is configured for storage of data thereon and may be implemented as a dual-edge sampled memory array. In one embodiment, the mode register 52 and the control circuit 53 are disposed in the interface circuit 50. The mode register 52 is configured to set a condition for entry of the memory device 500 into the low power consumption mode (which may be a specific value). When the control circuit 53 receives a command (cmd) instructing entry into the low power consumption mode, if a clock enable signal CKE is disabled (e.g., pulled low), the control circuit 53 enables, depending on the mode register 52, a signal instructing entry into the low power consumption mode (i.e., the PWD signal). As a result, the memory device 500 enters the low power consumption mode under the control of the signal. In some other embodiments, the memory device 500 may directly enter the low power consumption mode upon the reception of the command (cmd), without the involvement of the clock enable signal CKE.

More specifically, the low power consumption mode of the memory device 500 may include, for example, a self-refresh or power-down mode as specified in the JEDEC standards. Moreover, the low power consumption mode of the memory device 500 is controlled by the external memory controller 600.

For example, when the memory controller 600 issues the command instructing entry into the low power consumption mode and pulls the clock enable signal CKE low, the control circuit 53 reads a value of the mode register 52. The mode register 52 may be implemented as a mode register set (MRS), and the value thereof represents a user-defined predetermined condition for entry into the self-refresh or power-down mode. If the control circuit 53 determines that the predetermined condition is satisfied, then it enables the signal instructing entry into the low power consumption mode (PWD signal) to cause the memory device 500 to enter the self-refresh or power-down mode.

In the self-refresh mode, without refresh commands from the external memory controller 600, the memory device 500 will regularly refresh itself (e.g., count values of address counters, etc.) based on an internal logic circuit such as an internal timer so that data in the memory block 54 is naturally maintained at a reduced level of power consumption. In contrast, in the power-down mode, power for the memory device 500 and the external memory controller 600 may be cut off or reduced.

As another example, when the memory controller 600 pulls the clock enable signal CKE high or issues a command instructing exit from the low power consumption mode, the control circuit 53 will disable the signal instructing entry into the low power consumption mode (PWD signal) to cause the memory device 500 to exit the low power consumption mode.

It is noted that, different from the automatic periodic powering down of the DLL circuit 22 after the alignment of DQS and VCLK, in the present invention, the DLL circuitry system 51 is enabled and powered down under the control of the control circuit 53 after the memory device 500 enters into the low power consumption mode.

As a particular example, referring to FIG. 6, in this embodiment, the DLL circuit 22 may include a DLL delay line 11, a clock buffer circuit 12, a replica clock buffer circuit 13, a DLL phase detector 14 and a DLL controller 15. The DLL delay line 11 delays the external clock signal VCLK and outputs the delayed signal. The clock buffer circuit 12 is coupled to the DLL delay line 11. The DLL delay line outputs the clock signal CLKout, and the clock buffer circuit outputs the internal clock signal DQS. The DLL delay line 11 may be implemented as a voltage-controlled delay line controlled by the power supply voltage VDD. The replica clock buffer circuit 13 includes a replica of the clock buffer circuit 12 and is able to reproduce a delay of the external clock signal VCLK caused by its propagation through the clock buffer circuit 12 and other components. Moreover, it can generate a feedback clock signal DQS_fb from the clock signal CLKout output from the DLL delay line 11. The DLL phase detector 14 compares the feedback clock signal DQS_fb with the external clock signal VCLK. Based on the comparison of the DLL phase detector 14, the DLL controller 15 controls the DLL delay line 11 to adjust its delay.

Through configuring the delay of the DLL delay line 11, the DLL circuit 22 can reduce the phase difference between the incoming external clock signal VCLK and the output internal clock signal DQS. Moreover, the delay of the DLL delay line 11 can be incrementally adjusted so that the phase difference between the incoming external clock signal VCLK and the output internal clock signal DQS lies within a predetermined range (where the phase difference can be considered as zero). When this is achieved, the delay of the DLL delay line 11 is locked to allow the internal and external clocks to be kept synchronized (i.e., aligned) with each other through subsequent operation of the memory device 500.

An output terminal of the timer unit 21 is coupled to enable terminals of the DLL phase detector 14, the DLL controller 15 and the replica clock buffer circuit 13 in the DLL circuit 22. In this way, when the PWD signal arrives, the timer unit 21 can output the DLL enable signal Nap_en based on the predefined timer condition. A high level or rising edge of the DLL enable signal Nap_en can wake up the DLL phase detector 14, the DLL controller 15 and the replica clock buffer circuit 13 (i.e., enable the DLL circuit 22) to allow the DLL circuit 22 to lock the internal clock signal DQS in phase with the external clock signal VCLK again.

In this embodiment, the alignment and locking of DQS in phase with VCLK by the DLL circuit 22 particularly involves delaying of the external clock signal VCLK by the DLL delay line 11 and outputting of the delayed clock signal CLKout therefrom. The delayed clock signal CLKout is passed through the clock buffer circuit 12 and output therefrom as the internal clock signal DQS. At the same time, it is passed through the replica clock buffer circuit 13 and output therefrom as the feedback clock signal DQS_fb. The DLL phase detector 14 receives and compares the external clock signal VCLK and the feedback clock signal DQS_fb to assess a phase difference between them. Based on the comparison of the DLL phase detector 14 (i.e., an output signal from the DLL phase detector 14, which is not shown), the DLL controller 15 performs control to adjust the time delay provided by the DLL delay line 11. The DLL delay line 11, the DLL phase detector 14, the DLL controller 15 and the replica clock buffer circuit 13 form a closed control loop. The control is carried out until edges of the external clock signal VCLK are aligned with those of the internal clock signal DQS (e.g., with a phase difference between rising edges of the two lying within a predetermined range). The delay of the DLL delay line 11 is then locked.

Increasing or decreasing of the delay of the DLL delay line 11 accomplished under the control of the DLL controller 15 generally involves coarse delay adjustment and fine delay adjustment. The coarse delay adjustment may employ a minimum step which may be multiple times (i.e., 16 times) a minimum step employed in the fine delay adjustment. In normal operation of the DLL controller 15, the coarse delay adjustment usually precedes the fine delay adjustment, of the DLL delay line 11, and the fine delay adjustment is performed until the phase difference between the rising edges of VCLK and DQS is tuned into the predetermined range, followed by locking of the DLL circuit 22. The DLL controller 15 may include an internal DLL state machine 15a carrying an internal state signal (not shown). The state signal may transition depending on a sampled voltage level of VCLK at the rising edge of DQS, and the state machine may switch between different states in response to the transitioning of the state signal. The DLL state machine 15a in different states can control the delay of the DLL delay line 11 to be adjusted at different incremental steps.

Figure 11:
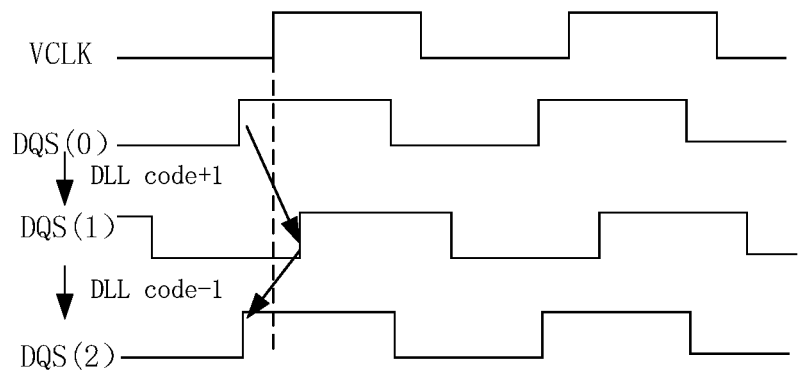
FIG. 11 is a schematic diagram showing a locking condition for the DLL circuit in the DLL circuitry system of FIG. 5.

Referring to FIG. 11, in the course of the fine delay adjustment of the DLL delay line 11 under the control of the DLL controller 15 at the minimum fine adjustment step, the DLL state machine 15a may determine whether the number of times the rising edge of DQS cross the rising edge of VCLK forth and back reaches a predetermined threshold value (e.g., 2, 3 or greater). If so, it can be considered that the phase difference between the rising edges of DQS and VCLK falls within the predetermined range, and the two are aligned with each other, and the DLL circuit 22 is then locked. When the DLL controller 15 determines that the phase locking has been achieved, it will lock a DLL code value for subsequent use in the next phase locking operation when the DLL enable signal Nap_en is again enabled. The locking of the DLL code value corresponds to locking of the DLL delay line 11 and hence the time delay provided thereby.

Figure 10A:
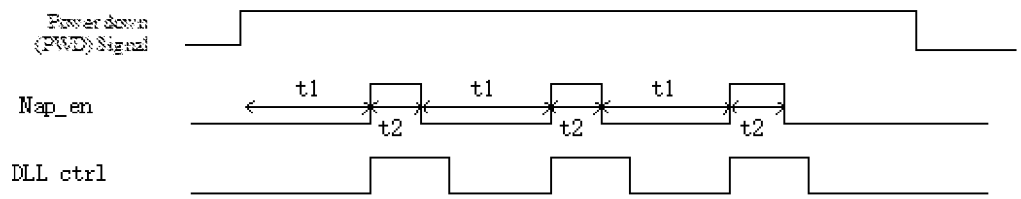
FIG. 10A is an exemplary timing diagram of operation of the DLL circuitry system of FIG. 5 for waking up a DLL controller with an enable signal Nap_en.

With continued reference to FIGS. 6, 10A and 15, in this embodiment, in response to the signal instructing entry into the low power consumption mode (i.e., the power down (PWD) signal), the memory device 500 incorporating the DLL circuitry system 51 enters the low power consumption mode in which the DLL phase detector 14, the DLL controller 15 and the replica clock buffer circuit 13 in the DLL circuit 22 are inactive, with the delay of the DLL delay line 11 being locked. At the same time, the PWD signal enables the timer unit 21. When a phase shift occurs in DQS due to jitter of the power supply voltage VDD, the timer unit 21 can output the DLL enable signal Nap_en (which is asserted at a high level, for instance) based on the predefined timer condition. For example, the DLL enable signal Nap_en may be asserted after a period of time t1, and its high level or rising edge can wake up the DLL phase detector 14, the DLL controller 15 and the replica clock buffer circuit 13 (i.e., enable the DLL circuit 22) to allow the DLL circuit 22 to lock the internal clock signal DQS in phase with the external clock signal VCLK again. After another period of time t2 (which may be longer than or equal to a minimum period of time required by the DLL circuit 22 to complete the relocking), the DLL enable signal Nap_en may be unasserted, again deactivating the DLL phase detector 14, the DLL controller 15 and the replica clock buffer circuit 13, with the delay of the DLL delay line 11 being locked. In case of the enable signal Nap_en being implemented as a pulse modulation signal with a duty cycle of t2/(t1+t2), the above processes may alternate until the PWD signal is unasserted and the memory device 500 exits the low power consumption mode.

Figure 10B:
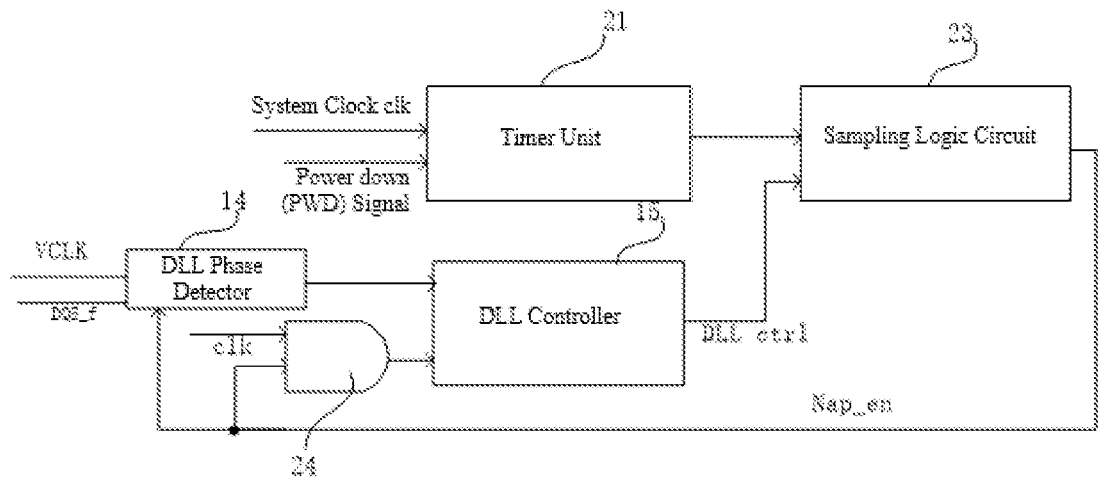
FIG. 10B is a schematic diagram showing an implementation of disabling the enable signal Nap_en in the DLL circuitry system of FIG. 5.

In some other embodiments, once the locking is completed, the DLL controller 15 may again disable the DLL phase detector 14, the DLL controller 15 and the replica clock buffer circuit 13 to allow them to consume less power. For example, after the locking is completed, the DLL controller 15 may output a DLL lock signal DLLctrl which disables the DLL enable signal Nap_en. As shown in FIG. 10B, the DLL circuit 22 may be woken up by the DLL enable signal Nap_en to lock the internal clock signal DQS in phase with the external clock signal VCLK again. When the DLL controller 15 determines that the phase locking has been achieved, it will lock a DLL code value for subsequent use in the next phase locking operation when the DLL enable signal Nap_en is again enabled.

As shown in FIG. 10B, in an example of another embodiment, the DLL controller 15 may additionally output a DLL control signal DLL ctrl, and a sampling logic circuit 23 may disable the DLL enable signal Nap_en based on both an output from the timer unit 21 and the DLL control signal DLL ctrl, thereby deactivating the DLL phase detector 14, the DLL controller 15 and the replica clock buffer circuit 13. The deactivation by the DLL controller 15 may be accomplished by a logic operation performed on a system clock clk and the DLL enable signal Nap_en by an AND logic circuit (e.g., an AND gate) 24.

With combined reference to FIGS. 6, 11 and 15, as any phase shift in DQS caused by variation of the power supply voltage VDD in the low power consumption mode is actually small (i.e., any phase difference between the rising edges of DQS and VCLK caused by variation of the power supply voltage VDD will exceed the predetermined range much), relocking would be attained with only a few delay adjustment steps of the DLL delay line 11, and it would be not necessary for the DLL circuit 22 to start operation as soon as any such shift occurs. Therefore, during relocking, the DLL controller 15 may control the DLL delay line 11 so that it switches to fine delay adjustment after a few (e.g., one or two) coarse delay adjustment steps, or that it skips coarse delay adjustment and directly performs fine delay adjustment. Moreover, DQS and VCLK can be locked in phase with each other again only with a few fine delay adjustment steps. In this case, the number of times of crossing serving as a criterion for determining by the state machine 15a whether relocking is achieved may be reduced compared to that for normal operation. For example, if the number of times of crossing reaches a first threshold value (e.g., 2 or 3, lower than the threshold value for normal operation), it can be considered that the phase difference between the rising edges of DQS and VCLK is within the predetermined range, i.e., relocking is achieved by the DLL circuit 22. That is, in the low power consumption mode, the DLL state machine 15a is allowed to roughly determine whether relocking is achieved by the DLL circuit, without having to undergo a standard process as in normal locking operation. Accordingly, in some other embodiments, the first threshold value may be smaller than the threshold value for determining whether the delay of the DLL delay line 11 is to be locked in normal operation of the DLL circuit. In this way, higher relocking efficiency can be achieved, and less power can be consumed during relocking.

In a particular example, referring to FIGS. 6 and 11, as a consequence of jitter of the power supply voltage VDD, DQS overall shifts to the left relative to VCLK that it was previously locked to and becomes DQS(0). Responsively, the DLL circuit 22 is woken up by the DLL enable signal Nap_en from the timer unit 21 and commences a relocking process, in which the DLL state machine 15a first outputs a DLL code value of "+1" for controlling the DLL delay line 11 to adjust its delay so that DQS overall shifts to the right until the rising edge of DQS crosses the rising edge of the VCLK for the first time and becomes DQS(1). Subsequently, the DLL state machine 15a outputs a DLL code value of "−1" for controlling the DLL delay line 11 to adjust its delay so that DQS overall shifts to the left until the rising edge of DQS crosses the rising edge of the VCLK for the second time and becomes DQS(2). At this point, the DLL state machine 15a determines that the number of times the rising edge of DQS crosses the rising edge of VCLK (i.e., 2) reaches the first threshold value, and it is therefore considered that the phase difference between the rising edges of DQS and VCLK lies within the predetermined range and the DQS and VCLK have been locked in phase with each other again. The DLL code value of the DLL state machine 15a is then locked.

Similarly, in case of DQS overall shifting to the right relative to VCLK due to jitter of the power supply voltage VDD, DQS may be first shifted to the left side of VCLK and then back to the right side thereof. In this way, the number of times the rising edge of DQS crosses the rising edge of VCLK is also 2, and DQS is again locked in phase with VCLK.

In this embodiment, the timer unit 21 includes a counter, which is enabled in response to the reception of the signal instructing entry into the low power consumption mode (PWD) and is inverted or reset after it counts to a count threshold (e.g., corresponding to n cycles of the system clock clk).

Figure 7:
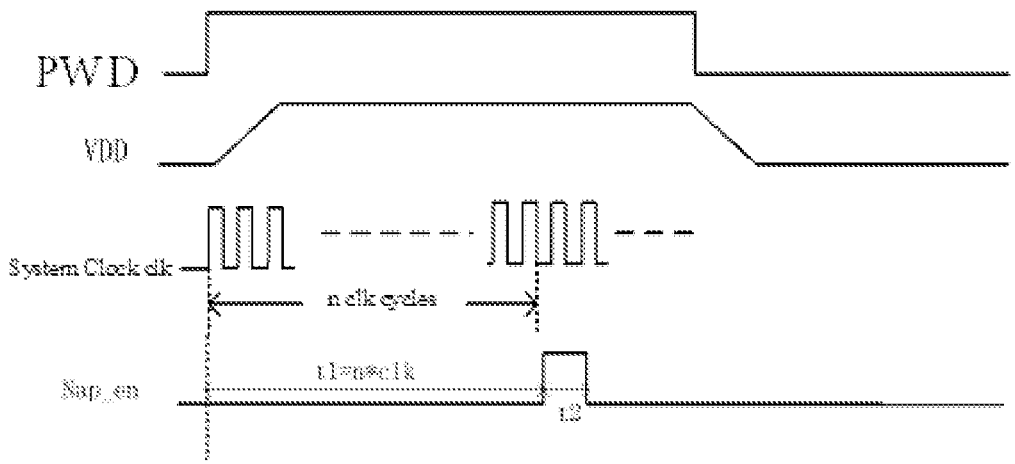
FIGS. 7 to 9 show three exemplary timing diagrams of operation of the DLL circuitry system of FIG. 5.

In an example of this embodiment, referring to FIG. 7, the predefined timer condition that the timer unit 21 is based on may be the count threshold n, and n may rely mainly on a stabilization time for the power supply voltage VDD (i.e., a stabilization time for an output voltage of the LDO circuit that powers the DLL circuit 22) and may be an empirical value greater than 0. The timer unit 21 may start counting as soon as it is enabled by the PWD signal and, upon its count reaching the count threshold n, assert the DLL enable signal Nap_en for enabling the DLL circuit 22. Specifically, as soon as the timer unit 21 is enabled by the incoming PWD signal, the counter in the timer unit 21 starts counting the number of cycles of the system clock clk, and when the count reaches n (i.e., the count threshold, which satisfies t1=n*clk), the timer unit 21 will pull the DLL enable signal Nap_en high, thereby enabling (i.e., waking up) the DLL circuit 22. As a result, the delay of the delay line 11 in the DLL circuit 22 is adjusted and relocked, and the internal clock signal DQS is locked in phase with the external clock signal VCLK again. In this example, a pulse width of the enable signal Nap_en from the timer unit 21 (i.e., t2) may be an empirical value, which may be determined by the stabilization time for the power supply voltage VDD and a length of time required by the DLL circuit to realign DQS with VCLK. Moreover, the count threshold n may determine the delay t1 between the times when the DLL circuit 22 is enabled and when the PWD signal arrives (i.e., t1=n*clk). It may also determine a start point for the DLL state machine 15a in the aforementioned standard locking process. N may be determined as an empirical value which ensures that the DLL circuit 22 is enabled to allow the delay of the delay line 11 to be adjusted only after the power supply voltage VDD of the DLL circuit 22 has become stable and that a reduced number of adjustment steps is allowed in the DLL delay line so that the relocking process can be completed faster within a shorter time.

This example is suitable for use in cases where the memory device 500 stays in the low power consumption mode for a period of time that is sufficiently long to allow the delay of the delay line 11 in the DLL circuit 22 to be adjusted after the power supply voltage has experienced a change due to entry of the memory device 500 into the low power consumption mode and stabilized (possibly at a higher level). However, if the memory device 500 stays in the low power consumption mode for a very short period of time (e.g., shorter than n system clock cycles), then at the time when the memory device 500 exits the low power consumption mode, the timer unit 21 may not have been enabled yet, or although it has been enabled, the time left is not sufficient for it to adjust and update the delay of the delay line 11. Consequently, the internal clock signal DQS remains unaligned with the external clock signal VCLK.

Figure 8:
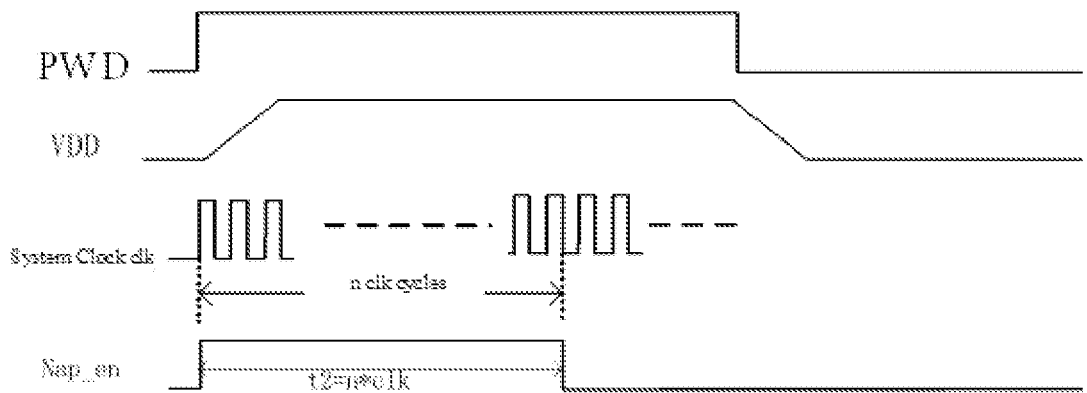

In another example of this embodiment, referring to FIG. 8, the predefined timer condition that the timer unit 21 is based on may be the count threshold n, and n may rely mainly on a stabilization time for the power supply voltage VDD (i.e., a stabilization time for the output voltage of the LDO circuit that powers the DLL circuit 22) and may be an empirical value greater than 0. As soon as the timer unit 21 is enabled by the PWD signal, it may start counting and outputting the enable signal Nap_en that is asserted and enables the DLL circuit 22. Upon the count reaching the count threshold n, it may stop enabling the DLL circuit 22 (by unasserting the enable signal Nap_en). That is, in this example, a rising edge of the enable pulse signal Nap_en from the timer unit 21 is aligned with a rising edge of the PWD signal, while a falling edge of the enable pulse signal Nap_en is determined by the count threshold n, as expressed by t1=0 and t2=n*clk. Specifically, as soon as the timer unit 21 is enabled by the incoming PWD signal, the counter in the timer unit 21 starts counting the number of cycles of the system clock clk, and the timer unit 21 starts outputting the DLL enable signal Nap_en to enable the DLL circuit 22. Upon the count reaching n, it stops enabling the DLL circuit 22.

In this example, the count threshold n may be set to a relatively large value so that the time length of n cycles of the system clock clk (i.e., t2) is not shorter than the stabilization time for the power supply voltage VDD of the DLL circuit 22 (i.e., the stabilization time for the output voltage of the LDO circuit that powers the DLL circuit 22). In this way, the DLL circuit 22 will operate across n cycles of the system clock clk after the PWD signal arrives and then stop operation as the count in the timer unit 21 reaches the count threshold n.

This example is suitable for use in cases where the memory device 500 stays in the low power consumption mode for a relatively short period of time, because even if the memory device 500 stays in the low power consumption mode for a very short period of time (e.g., shorter than n system clock cycles), it can still ensure that, at the time when the memory device 500 exits the low power consumption mode, the timer unit 21 has been enabled in the low power consumption mode for a period of time that is sufficiently long to allow the DLL circuit to update its delay to align the internal clock signal DQS with the external clock signal VCLK. However, this example requires greater power consumption because the DLL circuit is enabled for a longer period of time in the low power consumption mode.

Figure 9:
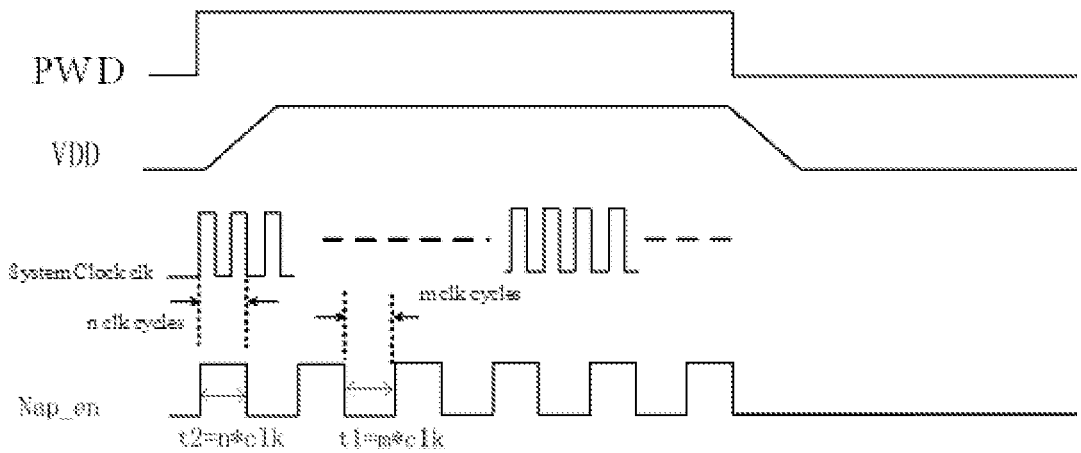

In a further example of this embodiment, referring to FIG. 9, the predefined timer condition that the timer unit 21 is based on may be a predetermined duty cycle of n/m, where n and m are both empirical values greater than 0. In this example, in the low power consumption mode of the memory device 500, the DLL enable signal Nap_en output from the timer unit 21 has the predetermined duty cycle n/m and thus enables the DLL circuit 22 intermittently until the PWD signal is disabled. That is, t1=m*clk and t2=n*clk are satisfied. Specifically, as soon as the timer unit 21 is enabled by the incoming PWD signal, the counter in the timer unit 21 starts counting the number of cycles of the system clock clk and outputting the enable signal Nap_en that is asserted and enables the DLL circuit 22. When the count reaches n, the enable signal Nap_en is unasserted to stop enabling the DLL circuit 22, and the counter is reset and starts counting the number of cycles of the system clock clk again. When the new count reaches m, the DLL circuit 22 is enabled again, and the counter is reset and starts counting again. This is repeated until the PWD signal is disabled (e.g., by the control circuit 53 under the control of the clock enable signal CKE that instructs exit from the low power consumption mode). Each period of the DLL enable signal Nap_en from the timer unit 21 consists of n consecutive cycles of the system clock clk and m consecutive cycles of the system clock clk. The DLL enable signal Nap_en from the timer unit 21 may have an empirical number of periods, which correspond to a length of time that is not shorter than a stabilization time for the power supply voltage VDD of the DLL circuit 22 (i.e., a stabilization time for the output voltage of the LDO circuit that powers the DLL circuit 22). Therefore, the predetermined duty cycle (n/m) is determined by at least one of: a change in the power supply voltage VDD of the DLL circuit 22 (i.e., the system power supply voltage); an offset of the internal clock signal from the external clock signal caused by entry of the memory device 500 incorporating the DLL circuitry system 51 into the low power consumption mode; the time taken by each calibration cycle of the DLL circuit 22; the stabilization time for the power supply voltage VDD; a time length of each system clock cycle on which the timer unit 21 is based to enable the DLL circuit 22; the number of cycles of the system clock clk taken by each calibration cycle of the DLL circuit 22; and so forth.

In this example, in the low power consumption mode of the memory device 500, the DLL circuit 22 is intermittently enabled by the DLL enable signal Nap_en from the timer unit 21. In this way, the delay of the DLL circuit 22 can be updated intermittently, avoiding any change in the delay of the DLL circuit 22 caused by variation of the power supply voltage VDD of the DLL circuit 22 upon entry into the low power consumption mode and maintaining the internal clock signal DQS in alignment with the external clock signal VCLK, while achieving a relatively low level of power consumption. Moreover, since the delay of the DLL circuit 22 is updated and adjusted multiple times, it is more accurate. In other words, the internal clock signal DQS can be more accurately aligned with the external clock signal VCLK.

All in all, no matter which of the above examples is used, in this embodiment, upon receipt of the PWD signal, the timer unit 21 is enabled and then generates, based on the predefined timer condition, the DLL enable signal Nap_en for enabling the DLL circuit 22. The enabled DLL circuit 22 then locks the internal clock signal DQS in phase with the external clock signal VCLK again. In this way, even when the memory device 500 is in the low power consumption mode, the DLL circuit 22 can relock the internal clock signal DQS to the external clock signal VCLK. Unlocking of the DLL circuit (i.e., the phase difference between the internal clock signal DQS and the external clock signal VCLK exceeds the predetermined range) that may be caused by a change in power supply voltage of the DLL circuit due to entry of the memory device into the low power consumption mode can be avoided. If this remains untreated when the memory device exits from the low power consumption mode, an error may occur when data is to be read or written immediately after the exit.

It is to be understood that the timer unit 21 may have any suitable circuit architecture and design, as long as it enables the timer unit 21 to provide the functions described herein. The system clock clk that it requires may be generated by an oscillator OSC, a crystal oscillator, a pulse generator or any other suitable electronic element or special-purpose circuit. It may alternatively obtained by dividing the external clock signal VCLK using a frequency divider. Apart from the counter, the timer unit 21 may also be implemented by a timer circuit consisting of, sequentially connected, an oscillator, a frequency divider and a counter, or another timer circuit such as a DFF line. The circuit architecture of the proposed DLL circuitry system is not limited to the components discussed in the foregoing embodiments, as it may also include some circuit modules required for the implementation of functions necessary for some chip systems.

Figure 12:
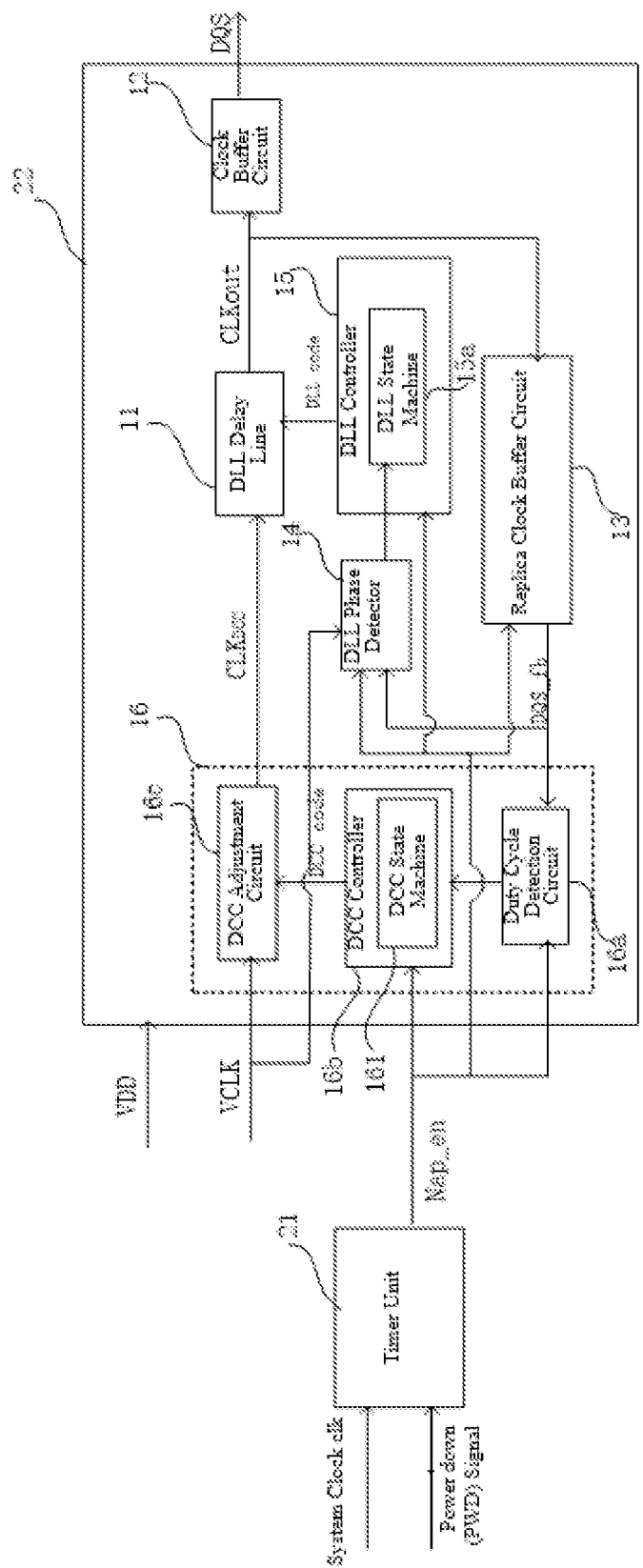
FIG. 12 is a schematic diagram showing the architecture of DLL circuitry system according to another embodiment of the present invention.

For example, in DLL circuitry system according to another embodiment of the present invention, referring to FIG. 12, the DLL circuit 22 further includes a duty cycle correction (DCC) circuit 16, which is coupled to the DLL delay line 11, the replica clock buffer circuit 13 and the timer unit 21 and is configured to adjust the duty cycle of the internal clock signal DQS based on the feedback clock signal DQS_fb output from the replica clock buffer circuit 13 until the duty cycle of the internal clock signal DQS reaches a predetermined value that is, for example, 50%. In this embodiment, the DLL circuit 22 can be locked only when the rising edge of DQS is aligned with the rising edge of VCLK and the duty cycle of DQS is reaches the predetermined value. It is to be noted that when the duty cycle of DQS reaches the predetermined value, it may be the same as a duty cycle of VCLK or not.

As an example, the DCC circuit 16 may include a duty cycle detection circuit 16a, a DCC controller 16b and a DCC adjustment circuit 16c. The duty cycle detection circuit 16a is coupled at an input terminal thereof to an output terminal of the replica clock buffer circuit 13 and is configured to measure a duty cycle of the feedback clock signal DQS_fb output from the replica clock buffer circuit 13. The DCC controller 16b is coupled to an output terminal of the duty cycle detection circuit 16a and is configured to generate, based on a detection result of the duty cycle detection circuit 16a, a DCC code which determines the duty cycle compensation provided by the DCC adjustment circuit 16c. The DCC adjustment circuit 16c is coupled to both the DCC controller 16b and the DLL delay line 11 and is configured to receive the external clock signal VCLK, generate an input clock signal CLK D cc with a corresponding duty cycle based on the DCC code output from the DCC controller 16b and provide it to the DLL delay line 11. Under the control of the DCC code regarding the duty cycle, the DCC adjustment circuit 16c adjusts the duty cycle of the generated input clock signal $CLK_{DCC}$ until the duty cycle of the internal clock signal DQS reaches the predetermined value (e.g., 50%). The input clock signal $CLK_{DCC}$ from the DCC circuit 16 is delayed by the DLL delay line 11 and then output by the clock buffer circuit 12 as the internal clock signal DQS.

Figure 13:
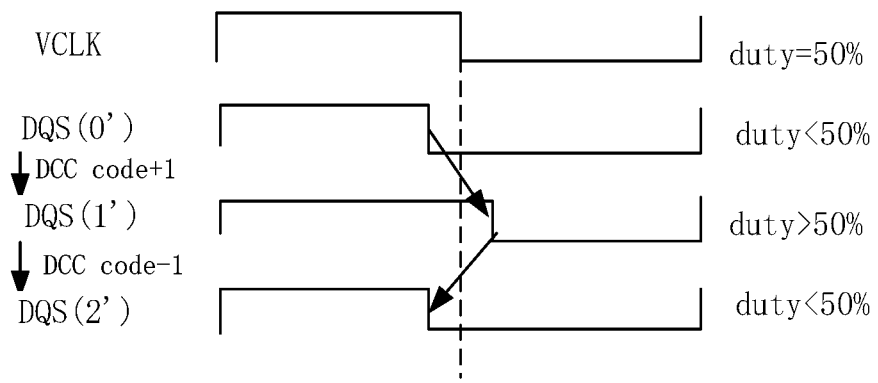
FIG. 13 is a schematic diagram showing another locking condition for a DLL circuit in the DLL circuitry system of FIG. 12.

Further, referring to FIG. 13, the DCC controller 16b may include a DCC state machine 161 carrying an internal state signal (not shown) which transitions depending on the detection result of the duty cycle detection circuit 16a (indicating whether the duty cycle of DQS has reached the predetermined value), and the state machine may switch between different states in response to the transitioning of the state signal. The DCC state machine 161 in different states can output different DCC code values which control the DCC adjustment circuit 16c to adjust the duty cycle of the input clock signal $CLK_{DCC}$ and hence that of DQS with different duty cycle adjustment steps.

The duty cycle detection circuit 16a detects the duty cycle of the feedback clock signal DQS_fb, determines whether it reaches the predetermined value for the duty cycle of DQS (e.g., 50%) and outputs a high or low level to the DCC controller 16b depending on the determination. The DCC state machine 161 in the DCC controller 16b updates the DCC code based on the output from the duty cycle detection circuit 16a and controls the DCC adjustment circuit 16c to adjust the duty cycle of the input clock signal $CLK_{DCC}$. Moreover, it determines whether the number of times the duty cycle of DQS_fb crosses the predetermined value (e.g., 50%) reaches a second threshold value. If so, it is considered that the duty cycle of the internal clock signal DQS reaches the predetermined value, and the value of the DCC code output from the DCC state machine 161 is locked for subsequent use in the next phase locking operation when the DLL enable signal Nap_en is again enabled.

With combined reference to FIGS. 12, 13 and 15, as any change in the duty cycle of DQS caused by variation of the power supply voltage VDD in the low power consumption mode is actually small, relocking would be attained with only a few duty cycle adjustment steps of the DCC adjustment circuit 16c. Thus, in the low power consumption mode, the DLL state machine 15a is allowed to roughly determine whether the duty cycle of the internal clock signal DQS reaches the predetermined value, without having to undergo a standard process in normal locking operation. Accordingly, in another embodiment, the second threshold value may be smaller than the threshold value for determining whether the duty cycle reaches the predetermined value in normal operation of the DLL circuit 22. In this way, higher relocking efficiency can be achieved, and less power can be consumed during relocking.

As an example, referring to FIGS. 12 and 13, both the duty cycle of VCLK and the predetermined value for the duty cycle of DQS are equal to 50%. As a consequence of jitter of the power supply voltage VDD, DQS that was previously locked changes into DQS (0'), and its duty cycle drops below 50%. That is, when its rising edge is aligned with the rising edge of VCLK, its falling edge is on the left side of that of VCLK. Responsively, the DLL circuit 22 is woken up by the DLL enable signal Nap_en from the timer unit 21 and commences a relocking process, in which the DCC state machine 161 first outputs a DCC code value of "+1" for controlling the DCC adjustment circuit 16c to increase the duty cycle of DQS above 50% so that when its rising edge is aligned with the rising edge of VCLK, its falling edge crosses the falling edge of VCLK for the first time. As a result, DQS (0') turns into DQS (1'). Subsequently, the DCC state machine 161 outputs a DCC code value of "−1" for controlling the DCC adjustment circuit 16c to decrease the duty cycle of DQS below 50% so that when its rising edge is aligned with the rising edge of VCLK, its falling edge crosses the falling edge of VCLK for the second time. As a result, DQS (1') turns into DQS (2'). At this point, the DCC state machine 16 determines that the number of times the duty cycle of DQS crosses 50% (i.e., 2) reaches the second threshold value, and it is therefore considered that duty cycle of DQS reaches the predetermined value (50%).

Similarly, in case of the duty cycle of DQS rising above 50% (i.e., when its rising edge is aligned with the rising edge of VCLK, its falling edge is on the right side of that of VCLK) due to jitter of the power supply voltage VDD, the duty cycle of DQS may be first reduced below 50% so that its falling edge moves to the left side of the falling edge of VCLK, and then raised above 50% so that its falling edge moves back to the right side of the falling edge of VCLK. In this way, the number of times the duty cycle of DQS crosses the predetermined value (50%) is also 2, and the duty cycle of DQS again reaches the predetermined value.

In this embodiment, the DLL circuit 22 may determine that phase locking is achieved when both the locking conditions shown in 11 and 13 are satisfied. When this happens, the DLL controller 15 and the DCC controller 16 will lock the DLL code value and DCC code value, respectively, for subsequent use in the next phase locking operation.

Figure 14:
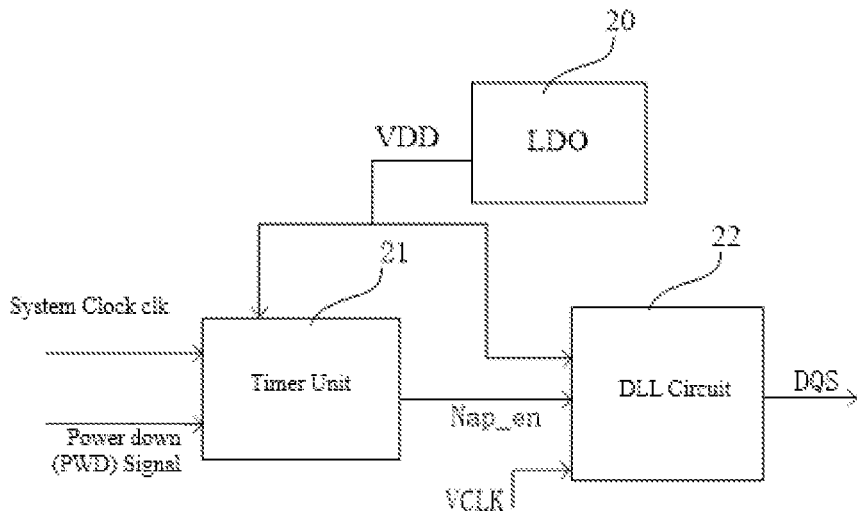
FIG. 14 is a schematic diagram showing the architecture of DLL circuitry system according to yet another embodiment of the present invention.

As another example, referring to FIG. 14, DLL circuitry system according to further embodiment of the present invention additionally includes a low dropout regulator (LDO) circuit 20 coupled to power supply terminals of the DLL circuit 22 and the timer unit 21. The LDO circuit 20 provides the power supply voltage VDD to both the DLL circuit 22 and the timer unit 21. Upon entry into the low power consumption mode, the power supply voltage VDD of the DLL circuit 22 will experience a change due to a load change of the LDO circuit 20.

Based on the same inventive concept, referring to FIGS. 5 and 15, in one embodiment of the present invention, there is also provided a memory device 500 including the proposed DLL circuitry system 51 discussed above. The internal clock signal DQS output from the DLL circuitry system 51 serves as a data strobe pulse signal for the memory device, and the DLL circuit 22 in the DLL circuitry system 51 synchronizes the external clock signal VCLK for the memory device 500 with the data strobe pulse signal (edge-to-edge alignment). Further, when the memory device 500 receives a read command cmd under the control of the external clock signal VCLK, it reads corresponding data under the control of the data strobe pulse signal DQS generated by the DLL circuit 22 and sends the data out.

On the one hand, in normal operation of the memory device 500, since the DLL circuitry system 51 can maintain edge-to-edge alignment of the internal clock signal DQS with the external clock signal VCLK, a reduced eye opening during data transmission can be avoided. On the other hand, when the memory device 500 enters the low power consumption mode, the power supply voltage VDD of the DLL circuit 22 will vary due to a load change of the LDO circuit 20, leading to a change in the delay of the gate circuit in the DLL delay line 11 of the DLL circuit 22 (e.g., the DLL delay line 11 consists of a number of NAND gates). For example, as a consequence of the entry into the low power consumption mode, the power supply voltage VDD from the LDO circuit 20 may rise and shorten the unit delay of the gate circuit in the DLL delay line 11, destroying the edge-to-edge alignment between the internal clock signal DQS and the external clock signal VCLK that is established in normal operation. In order to overcome this, the present invention can enable the timer unit 21 to wake up the DLL circuit 22 at a correct time to realign the internal clock signal DQS with the external clock signal VCLK to eliminate the adverse influence of the variation of the power supply voltage VDD from the LDO circuit 20 in the low power consumption mode and thereby ensure correct data reading or writing even when data is to be read or written immediately after the memory device 500 exits the low power consumption mode (at this time, the power supply voltage VDD output from the LDO circuit 20 has not yet recovered to the normal condition).

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:
1. Delay locked loop (DLL) circuitry system, comprising:
   a DLL circuit configured to receive an external clock signal and generate an internal clock signal delayed relative to the external clock signal and lock the internal clock signal in phase with the external clock signal; and
   a timer unit coupled to an enable terminal of the DLL circuit and configured to be enabled in response to a signal instructing entry into a low power consumption mode from outside of the DLL circuitry system and generate, based on the signal instructing entry into the low power consumption mode and a predefined timer condition, a DLL enable signal which enables the DLL circuit to allow the DLL circuit to relock the internal clock signal in phase with the external clock signal.

2. The DLL circuitry system of claim 1, which is disposed in a memory device, wherein the timer unit is configured to control the enabling of the DLL circuit when the memory device is in the low power consumption mode.

3. The DLL circuitry system of claim 2, wherein the memory device enters the low power consumption mode when receiving a command instructing the memory device to enter the low power consumption mode, wherein the low power consumption mode comprises a self-refresh mode or a power-down mode of the memory device.

4. The DLL circuitry system of claim 1, which is disposed in a memory device comprising:
   a mode register configured to set a condition for entry of the memory device into the low power consumption mode; and
   a control circuit configured to, when it receives a command instructing entry into the low power consumption mode and when a clock enable signal is disabled, enable the signal instructing entry into the low power consumption mode based on the condition set by the mode register,
   wherein the command instructing entry into the low power consumption mode and the clock enable signal are from a memory controller disposed outside of the memory device.

5. The DLL circuitry system of claim 1, wherein the predefined timer condition is a count threshold, and wherein the timer unit is configured to start counting in response to the signal instructing entry into the low power consumption mode is enabled, and upon the count reaching the count threshold, generate the DLL enable signal that enables the DLL circuit.

6. The DLL circuitry system of claim 1, wherein the predefined timer condition is a count threshold, and wherein the timer unit is configured to start counting and continuously enable the DLL enable signal that enables the DLL circuit in response to the signal instructing entry into the low power consumption mode is enabled and, upon the count reaching the count threshold, stop enabling the DLL circuit.

7. The DLL circuitry system of claim 5, wherein the count threshold is determined by a stabilization time for a power supply voltage of the DLL circuit.

8. The DLL circuitry system of claim 1, wherein the predefined timer condition is a predetermined duty cycle, and wherein the timer unit is configured to output, in response to the signal instructing entry into the low power consumption mode is enabled, the DLL enable signal which has the predetermined duty cycle and intermittently enables the DLL circuit until the signal instructing entry into the low power consumption mode is disabled.

9. The DLL circuitry system of claim 8, wherein the predetermined duty cycle is determined by at least one of: an amount of change in a power supply voltage of the DLL circuit; an offset of the internal clock signal from the external clock signal caused by entry of a memory device in which the DLL circuitry system is disposed into the low power consumption mode; a period of time taken by each calibration cycle of the DLL circuit; and a width of each cycle of a system clock on which the timer unit is based to enable the DLL circuit.

10. The DLL circuitry system of claim 1, wherein the DLL circuit comprises:
   a DLL delay line configured to delay the external clock signal and output the delayed external clock signal;
   a clock buffer circuit coupled to the DLL delay line and configured to output the clock signal output from the DLL delay line as the internal clock signal;
   a replica clock buffer circuit coupled to the DLL delay line and configured to generate a feedback clock signal based on the clock signal output from the DLL delay line;
   a DLL phase detector coupled to the replica clock buffer circuit and configured to compare the external clock signal with the feedback clock signal and determine a phase difference therebetween; and
   a DLL controller coupled to the DLL phase detector and the DLL delay line and configured to adjust, based on a comparison result from the DLL phase detector, a delay provided by the DLL delay line and hence the phase difference between internal clock signal and the external clock signal,
   wherein the timer unit is coupled to the DLL phase detector, the DLL controller and the replica clock buffer circuit.

11. The DLL circuitry system of claim 10, wherein after the DLL circuit is enabled and locks the internal clock signal in phase with the external clock signal, the DLL controller outputs a DLL lock signal which disables the DLL enable signal.

12. The DLL circuitry system of claim 10, wherein the DLL controller has a DLL state machine, which is coupled to the DLL phase detector and the DLL delay line and is configured to adjust, based on an output from the DLL phase detector, the delay of the DLL delay line and hence a phase of a rising edge of the internal clock signal, and when determining that the number of times the rising edge of the internal clock signal crosses a rising edge of the external clock signal forth and back reaches a first threshold value, lock the delay of the DLL delay line, thereby locking the internal clock signal in phase with the external clock signal.

13. The DLL circuitry system of claim 12, wherein the first threshold value is smaller than a threshold used in normal operation of the DLL circuit for determining whether to lock the delay of the DLL delay line.

14. The DLL circuitry system of claim 10, wherein the DLL circuit further comprises a duty cycle correction (DCC) circuit having an input terminal receiving the external clock signal, another input terminal coupled to an output terminal of the replica clock buffer circuit, and an output terminal coupled to an input terminal of the DLL delay line, the DCC circuit configured to adjust a duty cycle of the internal clock signal based on the feedback clock signal until the duty cycle of the internal clock signal reaches a predetermined value.

15. The DLL circuitry system of claim 14, wherein the DCC circuit comprises:
   a duty cycle detection circuit coupled at an input terminal thereof to the output terminal of the replica clock buffer circuit and configured to detect a duty cycle of the feedback clock signal;
   a DCC controller coupled to an output terminal of the duty cycle detection circuit and configured to generate a duty cycle control signal based on a detection result from the duty cycle detection circuit; and
   a DCC adjustment circuit coupled to the DCC controller and the DLL delay line and configured to receive the external clock signal, generate a corresponding input clock signal and provide it to the DLL delay line, and adjust a duty cycle of the generated input clock signal under the control of the duty cycle control signal until the duty cycle of the internal clock signal reaches the predetermined value.

16. The DLL circuitry system of claim 15, wherein the DCC controller has a DCC state machine, which is coupled to the duty cycle detection circuit and the DCC adjustment circuit and is configured to control, based on an output from the duty cycle detection circuit, the DCC adjustment circuit to adjust the duty cycle of the input clock signal and hence the duty cycle of the internal clock signal, and when determining that the number of times the duty cycle of the internal clock signal crosses the predetermined value forth and back reaches a second threshold value, determine that the duty cycle of the internal clock signal reaches the predetermined value.

17. The DLL circuitry system of claim 16, wherein the second threshold value is smaller than a threshold used in normal operation of the DLL circuit for determining whether the duty cycle reaches the predetermined value.

18. The DLL circuitry system of claim 1, further comprising a low dropout regulator (LDO) circuit coupled to both the timer unit and the DLL circuit so as to provide the timer unit and the DLL circuit with the power supply voltage, wherein the power supply voltage varies due to a load change of the LDO circuit in the low power consumption mode.

19. A memory device comprising the DLL circuitry system of claim 1, wherein the internal clock signal generated by the DLL circuitry system serves as a data strobe pulse signal for the memory device, and the DLL circuit in the DLL circuitry system locks the external clock signal for the memory device in phase with the data strobe pulse signal.

* * * * *